(12) United States Patent
Krummacher et al.

(10) Patent No.: US 7,982,387 B2
(45) Date of Patent: Jul. 19, 2011

(54) OPTOELECTRONIC COMPONENT

(75) Inventors: Benjamin Claus Krummacher, Regensburg (DE); Florian Schindler, Traunstein (DE); Norwin von Malm, Nittendorf (DE); Manfred Url, Nürnberg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 355 days.

(21) Appl. No.: 12/157,054

(22) Filed: Jun. 6, 2008

(65) Prior Publication Data
US 2009/0039272 A1 Feb. 12, 2009

(30) Foreign Application Priority Data

Jun. 8, 2007 (DE) .................. 10 2007 026 539
Jul. 11, 2007 (DE) .................. 10 2007 032 280

(51) Int. Cl.
*H05B 33/00* (2006.01)
*H04N 9/31* (2006.01)

(52) U.S. Cl. ........ 313/503; 313/113; 313/501; 362/800; 362/296.01; 362/341; 257/98; 257/13

(58) Field of Classification Search ................. None
See application file for complete search history.

(56) References Cited

U.S. PATENT DOCUMENTS

| 6,653,765 | B1 * | 11/2003 | Levinson et al. | 313/112 |
| 7,319,289 | B2 * | 1/2008 | Suehiro et al. | 313/485 |
| 7,554,263 | B2 * | 6/2009 | Takahashi | 313/506 |
| 2003/0111955 | A1 | 6/2003 | McNulty et al. | |
| 2004/0007969 | A1 | 1/2004 | Lu et al. | |
| 2004/0183963 | A1 | 9/2004 | Nakamura et al. | |
| 2004/0212296 | A1 | 10/2004 | Nakamura et al. | |

(Continued)

FOREIGN PATENT DOCUMENTS

DE   10 2004 037 096   3/2006

(Continued)

OTHER PUBLICATIONS

I. Schnitzer et al.: "30% external quantum efficiency from surface textured, thin-film light-emitting diodes" Appl. Phys. Lett. 63 (16), 18. (1993) (3 pages).

(Continued)

*Primary Examiner* — Ashok Patel
(74) *Attorney, Agent, or Firm* — Cohen Pontani Lieberman & Pavane LLP

(57) ABSTRACT

An optoelectronic component comprises a first electrode (3), a radiation-emitting layer sequence (1) having an active region (10) on the first electrode (3), which region has a main extension plane (E) with a surface normal (N) and emits an electromagnetic primary radiation having a non-Lambertian emission characteristic, a second electrode (4) on the radiation-emitting layer sequence (1), said second electrode being transparent to the primary radiation, and a wavelength conversion layer (2) in the beam path of the primary radiation, which converts the primary radiation at least partly into an electromagnetic secondary radiation. In this case, the first electrode (3) is reflective to the primary radiation, the non-Lambertian emission characteristic is given by an intensity $I(\alpha)$ of the primary radiation of the radiation-emitting layer sequence (1) as a function of an emission angle $\alpha$ measured with respect to the surface normal (N), the intensity $I(\alpha)$ increases from a $\alpha \geq 0°$ with increasing angle $\alpha$ up to a maximum angle $\alpha_{max}$, and the conversion probability of the electromagnetic primary radiation in the wavelength conversion layer (2) increases as the emission angle $\alpha$ increases.

18 Claims, 4 Drawing Sheets

U.S. PATENT DOCUMENTS

2005/0142379 A1     6/2005    Juni et al.
2006/0197443 A1*   9/2006    Setlur et al. .................. 313/512

FOREIGN PATENT DOCUMENTS

| DE | 10 2004 042 461 | 3/2006 |
|---|---|---|
| EP | 1 434 283 A2 | 6/2004 |
| WO | WO 2005/098986 | 10/2005 |
| WO | WO 2006/012841 | 2/2006 |
| WO | WO 2006/024278 | 3/2006 |

OTHER PUBLICATIONS

A. R. Duggal et al.: "Organic light-emitting device for illumination quality white light", Appl. Phys. Lett., vol. 80, No. 19 (2002) (3 pages).

B. C. Krummacher et al.: "Highly efficient white organic light-emitting diode", Appl. Phys. Lett., 88, 1 (2006) (3 pages).

A. Niko et al.: "Red-green-blue emission of parahexaphenyl devices with color-converting media", J. Appl. Phys., 82 (9) (1997) (6 pages).

J.-S. Kim et al.: "X-ray photoelectron spectroscopy of surface-treated indium-tin oxide thin films", Chem. Phys. Lett. 315, 307-312 (1999) (6 pages).

M. H. Lu et al.: "Optimization of external coupling and light emission in organic light-emitting devices: modeling and experiment", J. Appl. Phys., vol. 91, No. 2 (2002) (10 pages).

P. Schlotter et al.: "Luminescence conversion of blue light emitting diodes", Appl. Phys. A64, 417 (1997) (2 pages).

V. Bulovic et al.: "Weak microcavity effects in organic light-emitting devices", Phys. Rev. B 58, vol. 58, No. 7 (1998) (11 pages).

Nakamura, Shuji et al., "The Blue Laser Diode GaN Based Light Emitters and Lasers", © Springer-Verlag Berlin Heidelberg 1997.

Nakamura et al., "Enhanced Coupling of Light from Organic Electroluminescent Device Using Diffusive Particle Dispersed High Refractive Index Resin Substrate", Optical Review, vol. 13, No. 2 (2006), pp. 104-110.

* cited by examiner

OPTOELECTRONIC COMPONENT

RELATED APPLICATIONS

This application claims the priority of German patent application nos. 10 2007 026 539.7 filed Jun. 8, 2007 and 10 2007 032 280.3 filed Jul. 11, 2007. The entire content of both of which is hereby incorporated by reference.

FIELD OF THE INVENTION

The present application is related to an optoelectronic component.

SUMMARY OF THE INVENTION

One object of the present invention is to provide an optoelectronic component having an active region, which component furthermore has a wavelength conversion layer.

An optoelectronic component in accordance with at least one embodiment comprises:

a first electrode, a radiation-emitting layer sequence having an active region on the first electrode, which region has a main extension plane with a surface normal and emits an electromagnetic primary radiation having a non-Lambertian emission characteristic, a second electrode on the radiation-emitting layer sequence, said second electrode being transparent to the primary radiation, and a wavelength conversion layer in the beam path of the primary radiation, which converts the primary radiation at least partly into an electromagnetic secondary radiation, wherein the first electrode is reflective to the primary radiation, the non-Lambertian emission characteristic is given by an intensity $I(\alpha)$ of the primary radiation of the radiation-emitting layer sequence as a function of an emission angle $\alpha$ measured with respect to the surface normal, the intensity $I(\alpha)$ for angles $\alpha$ where $\alpha_{min} \leq \alpha \leq \alpha_{max}$ where $0° \leq \alpha_{min} \leq \alpha_{max}$ increases with increasing angle $\alpha$ from the minimum angle $\alpha_{min}$ up to the maximum angle $\alpha_{max}$, and the conversion probability of the electromagnetic primary radiation in the wavelength conversion layer increases as the emission angle $\alpha$ increases.

In this case, the intensity $I(\alpha)$ can be in particular the angle-dependent intensity distribution with which the primary radiation enters into the wavelength conversion layer. In particular, part of the primary radiation can pass through the wavelength conversion layer without being converted and can emerge from the wavelength conversion layer and be emitted by the latter. Furthermore, the electromagnetic secondary radiation can also emerge from the wavelength conversion layer and be emitted by the latter. For an external observer, therefore, a mixed-colored luminous impression can be perceived through superimposition of the electromagnetic primary radiation and electromagnetic secondary radiation. In this case, the mixed-colored luminous impression can depend on the relative proportions of the primary radiation and secondary radiation with respect to one another. The brightness impression, that is to say the brightness of the mixed-colored luminous impression, can furthermore depend on the absolute intensities of the primary radiation and secondary radiation. In order to be able to give an observer a homogeneous and isotropic mixed-colored luminous impression, it may be necessary that the same ratio of the intensity of the primary radiation to the intensity of the secondary radiation is perceptible at any emission angle $\alpha$.

In particular, the electromagnetic secondary radiation can be emitted isotropically by the wavelength conversion layer. This can mean that, independently of the emission angle $\alpha$ of the primary radiation entering into the wavelength conversion layer, the wavelength conversion layer can emit the secondary radiation—generated by conversion of part of the primary radiation—again independently of the angle $\alpha$ and the intensity of the secondary radiation which can be perceived by an observer is therefore not dependent on the angle $\alpha$.

The probability, however, of primary radiation being converted into secondary radiation in the wavelength conversion layer can furthermore be proportional to the path distance that can be traversed in the wavelength conversion layer. By virtue of the fact that the maximum path distance that can be traversed by the electromagnetic primary radiation in the wavelength conversion layer increases as the emission angle $\alpha$ increases, the probability of primary radiation being converted into secondary radiation can also increase as the emission angle $\alpha$ increases. The greater the emission angle $\alpha$, therefore, the smaller the relative proportion of the primary radiation in comparison with the primary radiation entering into the wavelength conversion layer at the angle $\alpha$ can be which emerges from the wavelength conversion layer again at the angle $\alpha$ without having been converted. By way of example, the wavelength conversion layer can be formed in planar fashion with a thickness D and in a plane parallel to the main extension direction of the organic layer sequence and be arranged above the organic layer sequence in the beam path of the primary radiation. The probability of a conversion of primary radiation into secondary radiation can therefore be proportional to $D/\cos \alpha$. As a result, an inhomogeneous mixed-colored luminous impression could arise depending on the angle $\alpha$ with respect to the normal to the surface of the organic layer sequence. Particularly, in the case of a Lambertian emission characteristic—which is customary for light-emitting diodes—with an angle-dependent intensity distribution proportional to $\cos \alpha$, this can mean that the proportion of the unconverted primary radiation emerging from the wavelength conversion layer for small angles $\alpha$ is greater than the proportion for large angles $\alpha$. As a result, in the case of customary light-emitting diodes, the luminous impression can vary depending of the emission angle $\alpha$ through a decrease in the relative proportion of the unconverted primary radiation in comparison with the secondary radiation.

By virtue of the fact, however, that the intensity $I(\alpha)$ of the primary radiation increases with increasing angle $\alpha$ proceeding from the minimum angle $\alpha_{min} \geq 0$ up to a maximum $\alpha_{max}$, the probability—dependent on the angle $\alpha$—of conversion of primary radiation into secondary radiation can be counteracted. In this case, the intensity $I(\alpha)$ can be represented by a monotonically rising function in the angle range $\alpha_{min} \leq \alpha \leq \alpha_{max}$. By way of example, the minimum angle can be the emission angle parallel to the surface normal, that is to say $\alpha_{min} = 0°$.

In this case, the emission characteristic of the primary radiation can have an intensity $I(\alpha)$ with a maximum intensity $I_{max}$ for the maximum angle $\alpha_{max}$. In particular, the maximum intensity $I_{max}$ can represent a global maximum of the intensity function $I(\alpha)$ for $0° \leq \alpha \leq 90°$, which means that the highest angle-dependent intensity $I_{max}$ is emitted in the emission direction $\alpha_{max}$. In this case, the maximum angle $\alpha_{max}$ can be greater than or equal to 10°. Furthermore, the maximum angle can be greater than or equal to 15° or more particularly preferably greater than or equal to 20°. Furthermore or in addition, the maximum angle can be less than or equal to 60° or preferably less than or equal to 65° or more particularly preferably less than or equal to 70°.

The emission characteristic of the primary radiation can be characterized by an intensity $I_0$ for an angle of $\alpha=0°$, that is to say in an emission direction parallel to the surface normal with respect to the main extension direction of the radiation-emitting layer sequence, and can be represented or approximated by the function $I_0/\cos\alpha$ for angles $\alpha$ in the range of $0°\leq\alpha\leq 90°$. Furthermore, the intensity $I(\alpha)$ can be parameterized by the function $I(\alpha)=I_0[1/\cos\alpha+A(\alpha)]$ for angles where $0°\leq\alpha\leq\beta$, wherein $\beta$ can be less than or equal to $15°$ or preferably less than or equal to $30°$ or more particularly preferably less than or equal to $65°$. In this case, $A(\alpha)$ can assume values in the range of $-Q\leq A(\alpha)\leq Q$ where $Q\leq 0.8$, preferably where $Q\leq 0.5$ or particularly preferably where $Q\leq 0.25$. This can mean, in particular, that $I(\alpha)$ can deviate from the proportionality to the inverse of $\cos\alpha$ by $\pm Q$. The intensity of the primary radiation that is emitted by the radiation-emitting layer sequence can thus be represented, for angles $\alpha$ where $0°\leq\alpha\leq\beta$, by a function $I(\alpha)$ having function values that can lie in a range having the width $2Q$ and the function $I_0/\cos\alpha$ and can deviate from the function $I_0/\cos\alpha$ by less than or equal to Q, that is to say $|I(\alpha)-I_0/\cos\alpha|\leq Q\cdot I_0$. In this case, the emission characteristic can have a maximum intensity $I_{max}$ for an angle $\alpha_{max}\leq\beta$ or for an angle $\alpha_{max}>\beta$.

The first electrode can comprise a material having a given reflectance R, and the radiation-emitting layer sequence can have a refractive index n for the electromagnetic primary radiation. In this case, the refractive index can be constant over the radiation-emitting layer sequence or be constant at least in partial regions, for example in different functional layers. Furthermore, the refractive index n can also vary over the radiation-emitting layer sequence. The active region of the radiation-emitting layer sequence can have a thickness d and be arranged in a manner spaced apart at an average distance L from the first electrode. In this case, the average distance L denotes the distance from the first electrode averaged over the thickness d of the active region. In this case, the parameters R, n, d and L can be chosen in such a way that the radiation-emitting layer sequence has the emission characteristic described above. By way of example, the reflectance R of the first electrode and the refractive index n of the radiation-emitting layer sequence can be predetermined on account of the respective choice of material, such that the desired emission characteristic can be made possible through the choice of the average distance L and the thickness d of the active region. As an alternative to this, the dimensions of the radiation-emitting layer sequence and of the active region, that is to say the average distance L and the thickness d, can be predetermined, for example by the construction or the production method of the optoelectronic component, such that the desired emission characteristic can be made possible through the choice of material for the reflective first electrode by way of the reflectance R thereof.

By way of example, for this purpose the average distance L can be of the order of magnitude of the wavelength of the primary radiation or smaller. If the primary radiation has a spectral distribution of a plurality of wavelengths and/or wavelength ranges, the primary radiation can in this case also be characterized by an average wavelength and the dimensions of the radiation-emitting layer sequence here and hereinafter can be related to the average wavelength of the primary radiation. Furthermore, the average distance can also be less than or equal to half the wavelength of the primary radiation or less than or equal to a quarter of the wavelength of the primary radiation or else less than or equal to an eighth of the wavelength of the primary radiation. Furthermore or in addition, the average distance L can be greater than or equal to $1/20$ of the wavelength of the primary radiation or else greater than or equal to $1/10$. This can mean, for example, that in the case of an ultraviolet to blue average wavelength of the primary radiation, the distance L can be between approximately 15 nm and 200 nm, preferably between 30 nm and 100 nm and particularly preferably between 40 nm and 60 nm.

Such an average distance L can bring about, in conjunction with the reflective first electrode, the formation of an at least half-side reflective cavity in the radiation-emitting layer sequence. In this case, a photon or wavepacket emitted by an excited state (exciton) in the active region can be reflected at the first electrode. By virtue of the fact that the average distance L can be of the order of magnitude of the wavelength of the primary radiation or smaller, to express it in simplified fashion a feedback of the emitted wavepacket with the excited state may still be possible during the emission of the wavepacket, such that the excited state, during the emission of the wavepacket, can be influenced by the electromagnetic field of its "own" reflected wavepacket. An amplification or attenuation of the emission of the excited state can therefore be made possible depending on the phase angle of the reflected wavepacket. In this case, the phase angle can be dependent on the refractive index of the radiation-emitting layer sequence, the reflectivity of the first electrode in conjunction with the penetration depth of the electromagnetic radiation into the first electrode, and on the distance between the excited state and the first electrode in conjunction with the emission direction of the wavepacket. As a result, in the radiation-emitting layer sequence a mode structure can form which can promote and/or bring about an emission of the primary radiation toward greater emission angles $\alpha$.

Furthermore, the thickness of the active region can influence the formation of emission modes. In particular, it can be advantageous in this case if the thickness d of the active region is less than or equal to 20 nm. Preferably, the thickness d can be less than or equal to 15 nm or furthermore less than or equal to 10 nm. Moreover, the thickness d of the active region can also be less than or equal to 5 nm.

In this case, the radiation-emitting layer sequence can be embodied as an organic radiation-emitting diode (OLED) or as an organic layer sequence. The organic layer sequence or the OLED can have a substrate, for example, wherein the first electrode can be arranged directly on the substrate. Since the first electrode is embodied in reflective fashion and the second electrode is transparent, this can mean that the primary radiation can be emitted in a direction away from the substrate ("top emitter"). As an alternative, the second electrode can be arranged directly on the substrate, such that the primary radiation can be emitted through the substrate ("bottom emitter"). A functional region having one or more functional layers composed of organic materials can be applied above the first electrode. In this case, the functional layers can have for example one or more electron injection layers (EIL), electron transport layers (ETL), hole blocking layers (HIL), electroluminescent layers (EL), electron blocking layers (EBL), hole transport layers (HTL), and/or hole injection layers (HIL). Individual layers can also have functionalities of a plurality of the aforementioned layers. Thus, a layer can serve for example as HIL and as HTL or as EIL and as ETL. The active region can for example be formed by an EL or comprise an EL. Furthermore, the active region can for example also be formed in the region of an interface of two layers, for instance at the interface between an ETL and an HTL.

By way of example, the substrate can comprise glass, quartz, plastic films, metal, metal films, semiconductor wafers such as, for instance, silicon wafers or a germanium wafer or wafers based on phosphorus- and/or nitrogen-containing semiconductor materials or any other suitable substrate material. If the organic layer sequence or the OLED is embodied as a so-called "bottom emitter", that is to say that the primary radiation generated in the active region is emitted through the substrate, then the substrate can be transparent to at least part of the primary radiation.

The first electrode can be embodied as a cathode and thus serve as an electron-inducing material. Inter alia, in particular aluminum, barium, indium, silver, gold, magnesium, calcium or lithium and compounds, combinations and alloys thereof can prove to be advantageous as cathode material.

The transparent second electrode, which can be embodied as an anode and can therefore serve as hole-inducing material, can for example comprise a transparent conductive oxide or consist of a transparent conductive oxide. Transparent conductive oxides ("TCO" for short) are transparent conductive materials, generally metal oxides, such as, for example, zinc oxide, tin oxide, cadmium oxide, titanium oxide, indium oxide or indium tin oxide (ITO). Alongside binary metal-oxygen compounds such as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, it may be possible that the TCOs do not necessarily correspond to a stoichiometric composition and can also be p- or n-doped. As an alternative or in addition, the second electrode can also comprise a metal, for example as mentioned in connection with the first electrode. By way of example, the second electrode can comprise a metal layer that is at least partly transparent to the primary radiation. Furthermore, the second electrode can also comprise an organic electrically conductive material.

The functional layers can comprise organic polymers, organic oligomers, organic monomers, organic small non-polymeric molecules ("small molecules") or combinations thereof. Depending on the materials in the functional layers, the first radiation generated can have individual wavelengths or ranges or combinations thereof from the ultraviolet to red spectral range.

Furthermore, the OLED can have an encapsulation in order to achieve protection against moisture and/or oxidizing substances such as oxygen, for instance, for the electrode and the functional region. In this case, the encapsulation can surround the entire OLED including the substrate. As an alternative, the substrate can form part of the encapsulation. In this case, the encapsulation can comprise one or more layers, wherein the layers of the encapsulation can be for example planarization layers, barrier layers, water and/or oxygen absorbing layers, connecting layers or combinations thereof. Furthermore, the encapsulation can be formed in transparent fashion, particularly in the case of an organic layer sequence formed as a "top emitter".

Furthermore, the radiation-emitting layer sequence can also be embodied as an inorganic light-emitting diode (LED), that is to say as an inorganic semiconductor layer sequence. In this case, the semiconductor layer sequence can be embodied as an epitaxial layer sequence, that is to say as an epitaxially grown semiconductor layer sequence. In particular, the semiconductor layer sequence can be embodied for example on the basis of an inorganic material, for instance InGaAlN, such as, for instance, as a GaN-thin-film semiconductor layer sequence. InGaAlN-based semiconductor layer sequences include in particular those in which the epitaxially produced semiconductor layer sequence, which generally has a layer sequence composed of different individual layers, contains at least one individual layer which comprises a material from the III-V compound semiconductor material system $In_xAl_yGa_{1-x-y}N$ where $0 \leq x \leq 1$, $0 \leq y \leq 1$ and $x+y \leq 1$.

As an alternative or in addition, the semiconductor layer sequence can also be based on InGaAlP, that is to say that the semiconductor layer sequence has different individual layers, at least one individual layer of which comprises a material from the III-V compound semiconductor material system $In_xAl_yGa_{1-x-y}P$ where $0 \leq x \leq 1$, $0 \leq y \leq 1$ and $x+y \leq 1$. As an alternative or in addition, the semiconductor layer sequence can also comprise other III-V compound semiconductor material systems, for example an AlGaAs-based material, or II-VI compound semiconductor material systems.

A further embodiment uses the semiconductor layer sequence in the form of a radiation-emitting thin-film semiconductor layer sequence. Furthermore, the radiation-emitting semiconductor layer sequence or the radiation-emitting thin-film semiconductor layer sequence can be embodied as a semiconductor light-emitting diode or thin-film semiconductor light-emitting diode. A radiation-emitting thin-film layer sequence or a thin-film semiconductor light-emitting diode is distinguished in particular by the following characteristic features:

a reflective layer is applied or formed at a first main area—facing toward a carrier element—of a radiation-generating epitaxial layer sequence, said reflective layer reflecting at least part of the electromagnetic radiation generated in the epitaxial layer sequence back into the latter;

the epitaxial layer sequence has a thickness in the region of 20 µm or less, in particular in the region of 10 µm; and the epitaxial layer sequence contains at least one semiconductor layer having at least one area which has an intermixing structure which ideally leads to an approximately ergodic distribution of the light in the epitaxial layer sequence, that is to say that it has an as far as possible ergodically stochastic scattering behavior. A basic principle of a thin-film semiconductor light-emitting diode is described for example in I. Schnitzer et al., Appl. Phys. Lett. 63 (16), Oct. 18, 1993, 2174-2176, the disclosure content of which in this respect is hereby incorporated by reference.

The materials and features mentioned in conjunction with the organic layer sequence can be employed with regard to the further elements of the radiation-emitting layer sequence such as, for instance, the substrate or the encapsulation and also with regard to the electrodes.

Furthermore, the radiation-emitting layer sequence can also have combinations of the abovementioned organic and inorganic layers.

Furthermore, instead of being embodied as an organic or inorganic diode, the radiation-emitting layer sequence can also be embodied as an electroluminescent layer sequence for an electroluminescent component (ELC), for example as an electroluminescent film (ELF). An ELC can have an active region comprising inorganic materials based on zinc sulfide, for example, which can be embedded in an electrically insulating material or be arranged between electrically insulating layers. The active region can furthermore have a suitable doping, which can comprise copper and/or europium, for example. An ELF can have plastic films between which the electrodes and the electroluminescent layer sequence are arranged and which can be conFigured as substrate and/or as encapsulation.

The wavelength conversion layer can comprise one or more wavelength conversion substances suitable for at least partly absorbing the electromagnetic primary radiation and emitting it as secondary radiation with a wavelength range that is at least partly different from the primary radiation. The electromagnetic primary radiation and electromagnetic secondary radiation can comprise one or more wavelengths and/or wavelength ranges in an infrared to ultraviolet wavelength range, in particular in a visible wavelength range. In this case, the spectrum of the primary radiation and/or the spectrum of the secondary radiation can be narrowband, that is to say that the primary radiation and/or the secondary radiation can have a single-color or approximately single-color wavelength range. As an alternative, the spectrum of the primary radiation and/or the spectrum of the secondary radiation can also be broadband, that is to say that the primary radiation and/or the secondary radiation can have a mixed-color wavelength range, wherein the mixed-color wavelength range can have a continuous spectrum or a plurality of discrete spectral components having different wavelengths. By way of example, the electromagnetic primary radiation can have a wavelength range from an ultraviolet to blue wavelength range, while the electromagnetic secondary radiation can have a wavelength range from a blue to red wavelength range. Particularly preferably, the primary radiation and the secondary radiation superimposed can give rise to a white-colored luminous impression. For this purpose, the primary radiation can preferably give rise to a blue-colored luminous impression and the secondary radiation a yellow-colored luminous impression, which can arise through spectral components of the secondary radiation in the yellow wavelength range and/or spectral components in the green and red wavelength range.

In this case, the wavelength conversion substance can comprise one or more of the following materials: garnets of the rare earths and the alkaline earth metals, for example YAG:$Ce^{3+}$, furthermore also nitrides, nitridosilicates, siones, sialones, aluminates, oxides, halophosphates, orthosilicates, sulfides, vanadates, perylenes, coumarin and chlorosilicates. The wavelength conversion layer can also comprise suitable mixtures and/or combinations which comprise for example the wavelength conversion substances mentioned. As a result, it may be possible, for example, that, as described above, the wavelength conversion layer absorbs in a blue first wavelength range and emits in a second wavelength range having green and red wavelengths and/or yellow wavelength ranges.

Furthermore, the wavelength conversion layer can comprise a transparent matrix material which surrounds or contains the wavelength conversion substance or substances, or is chemically bonded to the wavelength conversion substance. The transparent matrix material can comprise for example silicones, epoxies, acrylates, imides, urethanes, carbonates, olefins or derivatives thereof in the form of monomers, oligomers or polymers as mixtures, copolymers or compounds therewith. By way of example, the matrix material can be an epoxy resin, polymethyl methacrylate (PMMA) or a silicone resin such as polydimethylsiloxane, for instance.

In this case, the wavelength conversion substance or substances can be distributed homogeneously in the matrix material. As an alternative to this, the wavelength conversion layer can comprise a plurality of wavelength conversion substances arranged in different layers in the wavelength conversion layer.

The wavelength conversion layer can furthermore have a transparent carrier substrate, on which one or more wavelength conversion substances are applied directly or on which a matrix material with one or more wavelength conversion substances is applied. By way of example, the materials mentioned above in connection with the substrate for the radiation-emitting layer sequence may be suitable as substrate material.

The wavelength conversion layer can furthermore be optically coupled to the radiation-emitting layer sequence by means of a refractive index matching material, or an optically coupling material, for instance a refractive index matching gel or oil. For this purpose, for example in the case of a radiation-emitting layer sequence embodied as a "bottom emitter", for example an OLED or LED in "bottom emitter" configuration, the wavelength conversion layer can be optically coupled to the substrate of the radiation-emitting layer sequence by means of an optical gel. As an alternative to this, in the case of radiation-emitting layer sequence embodied as a "top emitter", the wavelength conversion layer can be arranged on the second electrode or on an encapsulation by means of an optical gel.

If expedient, additional layers such as, for example, connecting layers, adhesive layers or further functional layers can be arranged between the radiation-emitting layer sequence and the wavelength conversion layer.

DETAILED DESCRIPTION OF THE DRAWINGS

In the exemplary embodiments and figures, identical or identically acting constituent parts may in each case be provided with the same reference symbols. The elements illustrated and their size relationships among one another should not be regarded as true to scale, in principle, rather individual elements such as, for example, layers, structural parts, components and regions may be illustrated with exaggerated thickness or size dimensions for the sake of better representability and/or in order to afford a better understanding.

In the exemplary embodiments below, optoelectronic components only having organic layer sequences are described purely by way of example. These layer sequences can also be replaced by or combined with inorganic layer sequences of electroluminescent layer sequences as described in the general part of the description.

Figure 1:
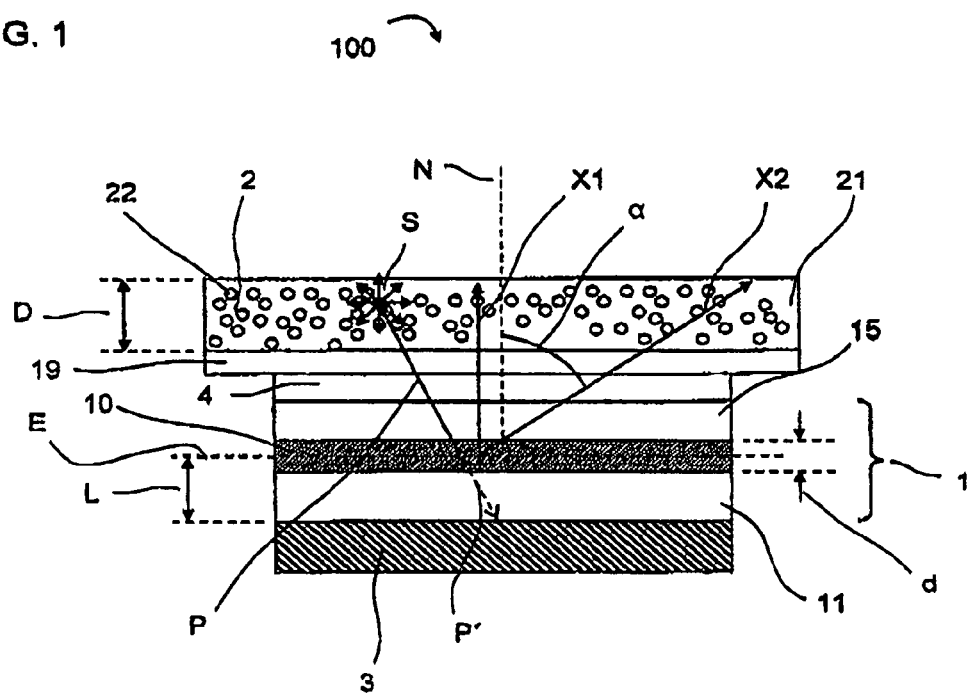
FIG. 1 shows a schematic illustration of an optoelectronic component in accordance with one exemplary embodiment.

FIG. 1 shows an exemplary embodiment of an optoelectronic component 100 having an organic layer sequence 1 and a wavelength conversion layer 2.

The organic layer sequence 1 has an active region 10, which can emit during operation blue electromagnetic primary radiation, indicated by way of example by the arrow P. Furthermore, the organic layer sequence 1 comprises functional layers 11 and 15, which are formed for example as an electron transport layer 11 and as a hole transport layer 15 as explained in the general part of the description. In this case, the active region 10 is the region in which injected electrons and holes from the functional layers 11 and 15 can recombine in order to generate the electromagnetic primary radiation. The organic layer sequence 1 is arranged on a first electrode 3, which is embodied such that it is reflective to the primary radiation. In the exemplary embodiment shown, the reflective first electrode 3 is composed of a metal, silver, in particular, being suitable for this. Furthermore, a second electrode 4 is arranged on the organic layer sequence 1, which second electrode is composed of a transparent conductive oxide that is transparent to the primary radiation. The electromagnetic primary radiation generated in the active region 10 can thus be emitted through the second electrode 4. The organic layer sequence 1 and the electrodes 3 and 4 are applied on a substrate 19, wherein the transparent second electrode 4 faces the substrate 19 and is arranged on the latter. The substrate 19 is glass in the exemplary embodiment shown.

The active region 10 has a main extension plane E, which can be characterized by a surface normal N. The active region 10 furthermore has a thickness d and an average distance L from the first electrode 3.

Arranged above the substrate 19 is the wavelength conversion layer 2, which comprises a wavelength conversion substance 22 embedded in a matrix material 21 in accordance with the explanations presented above. The matrix material 21 in the exemplary embodiment shown is an epoxy resin, which, like the glass substrate 19, has a refractive index of approximately 1.5. In the exemplary embodiment shown, the wavelength conversion substance 22 is a mixture of a nitridosilicate and YAG:$Ce^{3+}$ and is suitable for converting the blue electromagnetic primary radiation into yellow-colored electromagnetic secondary radiation. In this case, the secondary radiation is emitted isotropically, that is to say uniformly in all directions, as is indicated by way of example by the arrows S.

The wavelength conversion layer 2 is embodied in planar fashion and has a thickness D. The wavelength conversion layer 2 is arranged parallel to the main extension plane E of the active region 1.

The arrow X1 indicates an emission direction of the electromagnetic primary radiation parallel to the surface normal N. The probability of primary radiation emitted in said direction being converted into secondary radiation in the wavelength conversion layer 2 is proportional to the maximum distance that can be transversed by the primary radiation in the wavelength conversion layer 2 and thus proportional to the thickness D of the wavelength conversion layer 2. For primary radiation with an emission direction that deviates from the emission direction X1, such as primary radiation which is emitted along the emission direction X2 at an emission angle $\alpha$ with respect to the surface normal N, the maximum path distance that can be traversed through the wavelength conversion layer 2 rises proportionally to D/cos $\alpha$. Consequently, the conversion probability is therefore also proportional to D/cos $\alpha$. It can thus easily be seen that the probability of primary radiation being converted into secondary radiation increases, the larger the emission angle $\alpha$ with respect to the surface normal N. The relative proportion of the primary radiation in relation to the total primary radiation radiated into the wavelength conversion layer 2 at the angle $\alpha$ which leaves the wavelength conversion layer 2 at an emission angle $\alpha$ without having been converted therefore decreases as the angle $\alpha$ increases.

The dashed arrow P' indicates the effect of the reflective first electrode 3 on the emission of the primary radiation in the active region as explained further above. The emission characteristic of the primary radiation is influenced by the above-described self-influencing of an exciton by its "own" emitted radiation. In the case of the simplified illustration it should be taken into consideration that the arrow P' does not represent propagation and reflection of a light ray in the traditional sense. Rather, the primary radiation emitted by an exciton can be described in the form of a dipole radiation field which propagates in the organic layer sequence and is reflected by the first electrode 3.

Figure 2:
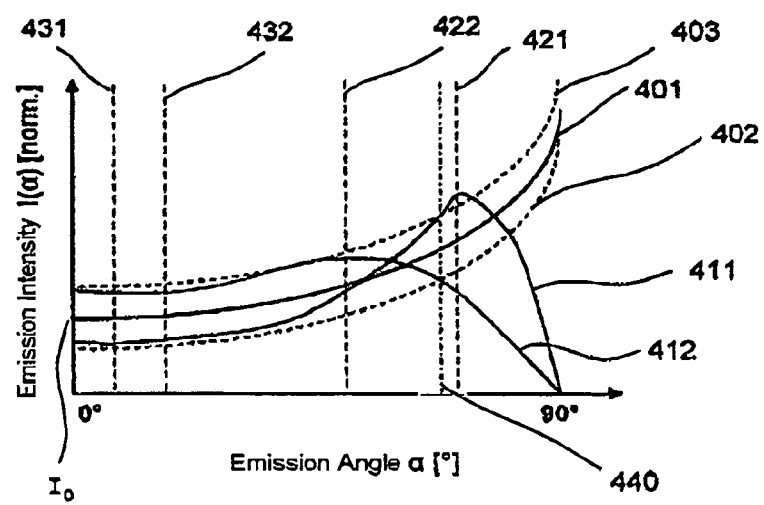
FIG. 2 shows graphs of emission characteristics of the primary radiation.

FIG. 2 shows graphs for emission characteristics with emission intensities $I(\alpha)$ of the primary radiation of an organic layer sequence for optoelectronic components in accordance with the description above. The emission angle $\alpha$ is plotted on the horizontal axis, while the angle-dependent normalized emission intensity is plotted on the vertical axis.

The emission intensity 401 exhibits a dependence proportionally to 1/cos $\alpha$, which can be characterized by an intensity $I_0$ in the case of an emission parallel to the surface normal N. In accordance with the explanations above it can easily be seen that such an emission characteristic can counteract the above-described angle-dependent conversion probability for the electromagnetic primary radiation and can at least partly compensate for this. The emission intensities 402 and 403 are shifted relative to the emission intensity 401 by an intensity $+Q \times I_0$ and $-Q \times I_0$ on the vertical axis. The graphs 402 and 403 reveal a function region which, in accordance with the description in the general part, suitable emission intensities $I(\alpha)$ of optoelectronic components can run from $\alpha=0°$ up to a limit angle $\alpha=\beta$. As explained above, such functions for emission intensities can be represented by functions $I(\alpha)=I_0[1/\cos \alpha + A(\alpha)]$, where $A(\alpha)$ is chosen such that $|I(\alpha)-I_0/\cos \alpha| \leq Q \times I_0$ holds true for an angle range of $0° \leq \alpha \leq \beta$.

The primary radiation emission intensities 411 and 412 are shown by way of example for this, and for both of them the same angle $\beta$ holds true, indicated by the vertical broken line 440. The emission intensity 411 has a maximum intensity $I_{max}$ at an angle $\alpha_{max}$, indicated by the vertical broken line 421. From an emission angle $\alpha_{min}$, indicated by the vertical broken line 431, up to the angle $\alpha_{max}$ (line 421), the emission intensity increases and can be characterized in this range by a monotonically increasing function profile. The emission intensity 412 likewise has a monotonically increasing function profile for emission angles $\alpha$ between the associated minimum angle $\alpha_{min}$ (line 432) and the maximum angle $\alpha_{max}$ (line 422). The emission intensities 411 and 412 are examples of an entire function class of emission intensities $I(\alpha)$ which, in accordance with the description above, can be suitable emission intensities $I(\alpha)$ for the optoelectronic components explained.

The CIE color locus distributions of the emitted superimposition of the primary radiation and secondary radiation for two optoelectronic components 100 in accordance with FIG. 1 with different emission intensities $I(\alpha)$ of the primary radiation are determined by means of ray tracing simulations, as will now be described below. As described above, the emission intensity of the simulated optoelectronic components 100 can be achieved by variations of the reflectivity R of the first electrode 3, the refractive index n of the organic layer sequence 1 and/or the distance L between the active region 10 and the first electrode 3 in conjunction with a suitable choice of the thickness d of the active region 10. A conventional blue OLED with a yellow-emitting luminescence converter was likewise simulated for comparison. The simulated radiation coupling-out efficiency for the conversion in the luminescence converter of the conventional OLED was 0.62, and that for the conversion in the wavelength conversion layer 2 of the optoelectronic components 100 was 0.62 for the emission characteristic 202 and 0.59 for the emission characteristic 203. Thus, all the radiation coupling-out efficiencies were approximately 0.6.

Figure 3A:
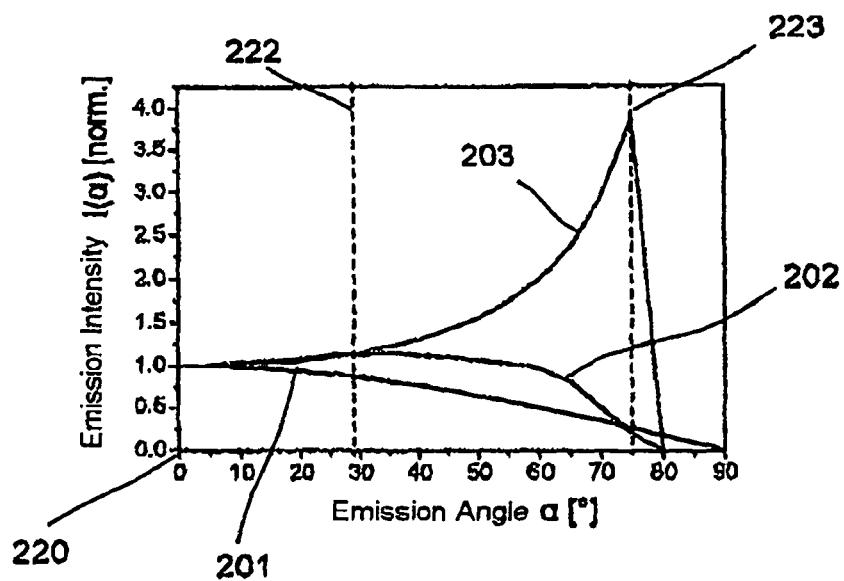
FIGS. 3A and 3B show simulations for emission characteristics and resultant angle-dependent CIE color locus distributions for optoelectronic components in accordance with further exemplary embodiments.

FIG. 3A shows the three emission characteristics—assumed for the simulation—of the primary radiation for the conventional OLED (curve 201) and the organic layer sequences 1 of optoelectronic components 100 in accordance with FIG. 1 (curves 202 and 203), wherein the three emission intensities 201, 202 and 203 are plotted on the vertical axis in each case as a function of the emission angle α on the horizontal axis.

The emission intensity 201 of the conventional OLED shows the typical emission characteristic of a Lambertian emitter, that is to say an emersion intensity I(α) proportional to cos α, as is typical of known light-emitting diodes. The emission intensities in accordance with the curves 202 and 203 show emission characteristics that deviate from the Lambertian emission characteristic. The emission intensities 202 and 203 each have a minimum angle $α_{min}=0°$ (coinciding with the vertical axis, indicated by the reference symbol 220) and a maximum angle $α_{max}$ (respective vertical broken lines 222 and 223), between which the respective emission intensity increases up to the maximum intensity $I_{max}$ as the emission angle α increases. In this case, the maximum angle $α_{max}$ for the emission intensity 202 is approximately 30°. By contrast, the emission characteristic in accordance with the curve 203 shows an emission intensity I(α) proportional to 1/cos α up to a maximum angle $α_{max}$ of approximately 80°.

Figure 3B:
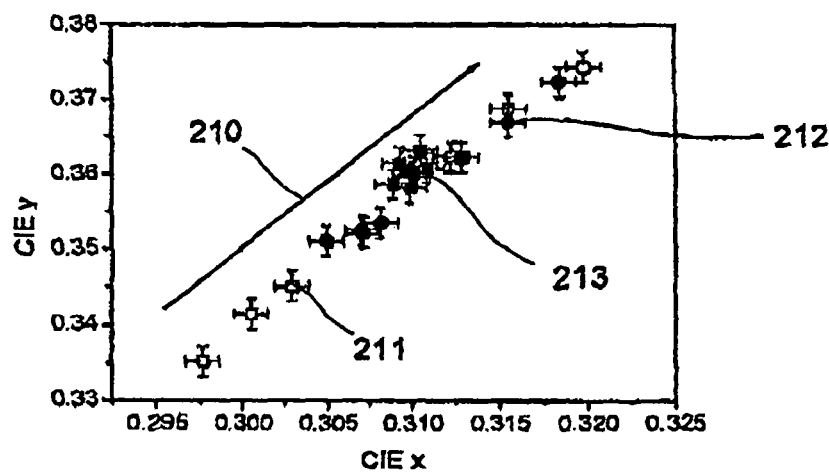

The color loci—resulting from the emission characteristics in accordance with the curves 201, 202 and 203—of the superimpositions of the primary radiation and secondary radiation in the known CIE diagram as a function of the emission angle α between 0° and 70° were determined by means of ray tracing simulations and are shown in FIG. 3B. In this case, the arrow 210 indicates the increasing emission angle α. The points 211 (open squares) indicate the CIE color loci of the electromagnetic radiation emitted by the typical OLED with luminescence converter with blue primary radiation and yellow secondary radiation with the emission intensity 201 in FIG. 3A, which is perceived by an observer depending on the emission angle α between 0° and 70°. It is evident from the CIE diagram shown that, as the emission angle α increases, a yellow shift in the luminous impression can be perceived on account of the angle-dependent conversion probability in the luminescence converter. The points 212 (filled-in circles) indicate the corresponding CIE color locus variations for the emission characteristic in accordance with curve 202 in FIG. 3A for an optoelectronic component 100 in accordance with FIG. 1. The points 213 (filled-in squares) correspondingly indicate the color locus variation for the emission characteristic in accordance with the curve 203 in FIG. 3A for an optoelectronic component 100 in accordance with FIG. 1. It is clearly evident that with increasing deviation from the Lambertian emission characteristic and an increasing shift in the maximum emission intensity $I_{max}$ toward large maximum angles $α_{max}$, it is possible to establish a reduction of the color locus variation with the emission angle.

Figure 4A:
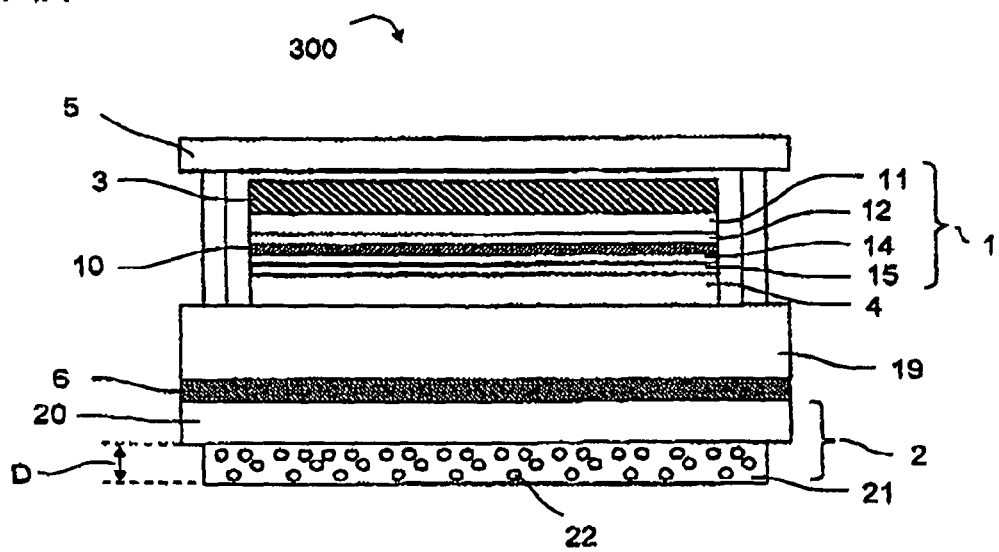
FIGS. 4A and 4B show schematic illustrations of optoelectronic components in accordance with further exemplary embodiments.

FIG. 4a shows a further exemplary embodiment of an optoelectronic element 300. As shown in the exemplary embodiment in FIG. 1, the optoelectronic element 300 also has transparent glass substrate 19, on which an organic layer sequence 1 is arranged between the first and second electrodes 3, 4. The electrodes 3 and 4 and the organic layer sequence 1 were applied by means of standard evaporation processes. The organic layer sequence 1 has in particular materials comprising organic small molecules.

The transparent second electrode 4 is applied on the substrate 19. In the exemplary embodiment shown, the second electrode 4 is composed of ITO. The organic layer sequence 1 is applied on the second electrode 4, said organic layer sequence comprises a hole injection layer (HIL) 15 on the second electrode 4 and an electron blocking layer (EBL) 14 above said hole injection layer. An electroluminescent layer (EL) 10 is applied on the EBL 14, and forms the active region of the organic layer sequence 1. The EL 10 is suitable for emitting blue primary radiation during operation of the optoelectronic component 300. A hole blocking layer (HBL) 12 is applied above the EL 10 and an electron transport layer (ETL) 11 is applied above said hole blocking layer. The first electrode 3 composed of silver is arranged above the organic layer sequence 1, said first electrode being reflective to the primary radiation emitted by the EL 10. Since the substrate 19 and the second electrode 4 are transparent, the optoelectronic component is embodied as a so-called "bottom emitter".

By virtue of the embedding of the EL 10 between the EBL 14 and the HBL 12, it is possible to achieve a good localization and delimitation of the active region 10 of the organic layer sequence 1 since excitons, that is to say electron-hole pairs, can only be formed between the EBL 14 and the HBL 12.

Arranged above the electrodes 3, 4 and the organic layer sequence 1 is an encapsulation 5 that can protect the electrodes 3, 4 and the organic layer sequence 1 against harmful external influences such as, for instance, moisture or oxygen or mechanical impairments.

A wavelength conversion layer 2 is arranged on that surface of the substrate 19 which is remote from the organic layer sequence 1, in the beam path of the primary radiation of the organic layer sequence 1. Said wavelength conversion layer has a carrier substrate 20 composed of glass, on which nitridosilicate-containing and YAG:$Ce^{3+}$-containing wavelength conversion substances 22 in an epoxy resin matrix material 21 are applied. In order to produce the wavelength conversion layer 2, the wavelength conversion substances 22 together with epoxy resin materials are uniformly comminuted and intermixed in a milling unit. The mixture was applied to the substrate 20 and cured for one hour at 150° C. The thickness D of the cured matrix material 21 with the wavelength conversion substances 22 is approximately 30 μm.

The wavelength conversion layer 2 is applied and optically coupled on the substrate 19 by means of an optical gel 6.

Figure 4B:
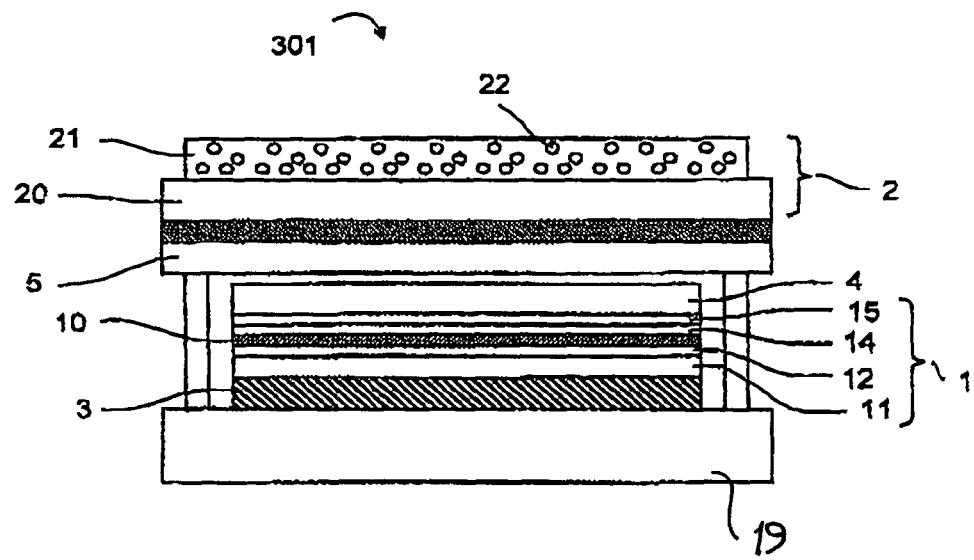

FIG. 4B shows a further exemplary embodiment of an optoelectronic component 301, which represents a variation of the optoelectronic component 300 shown in FIG. 4A. In the case of the optoelectronic component 301, the first electrode 3, which is reflective to the primary radiation, is applied on the substrate 19. The organic layer sequence 1 is arranged above the reflective first electrode 3 in the manner described above, but in the opposite order. The transparent second electrode 4 composed of ITO is arranged above the layer sequence 1. The encapsulation 5 likewise has a transparent material, for instance glass or a transparent plastic. Thus, the primary radiation generated in the EL 10 can be emitted in a manner directed away from the substrate 19 through the second transparent electrode 4 and the optoelectronic component 301 is thus embodied as a so-called "top emitter". The wavelength conversion layer 2 is applied and optically coupled on the encapsulation 5 by means of the optical gel 6.

Three optoelectronic components embodied as OLEDs I, II and III, in accordance with the exemplary embodiment of the optoelectronic component 300 as shown in FIG. 4A, were produced for a measurement of the emission characteristics and the CIE color locus distributions of the electromagnetic radiation emitted. In this case, all three optoelectronic components I, II and III have approximately the following thicknesses of the electrodes 3, 4 and of the layers 10, 11, 12, 14 15 of the organic layer sequence 1:

second electrode 4: 120 nm,
HIL 15: 20 nm,

EBL 14: 10 nm,
EL 10: 25 nm,
HBL 12: 10 nm,
ETL 11: x nm,
first electrode: 150 nm.

The thickness x of the ETL 11 was approximately 15 nm, 30 nm and 50 nm for the optoelectronic components I, Ii and II, respectively. As a result, the average distance L between the reflective first electrode and the active region for the OLEDs I, Ii and III is changed in comparison with one another.

Figure 5A:
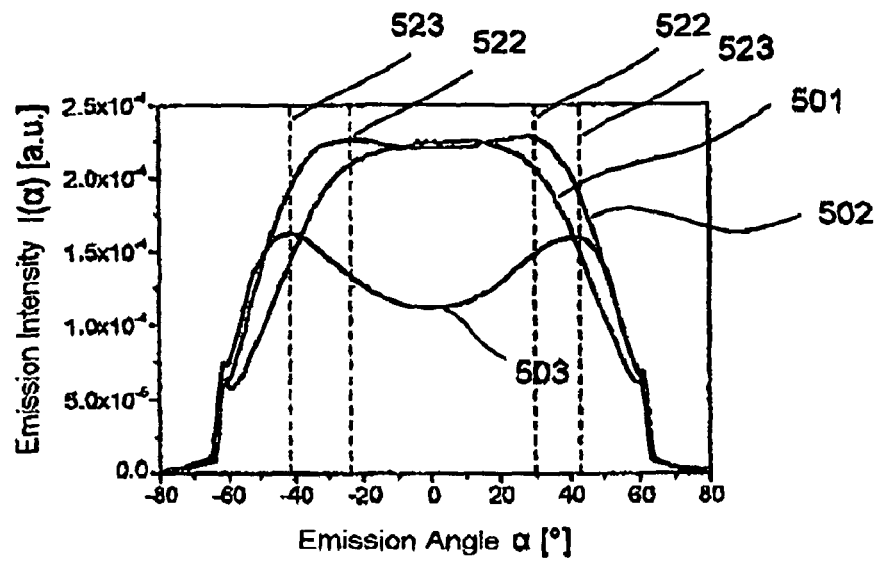
FIGS. 5A and 5B show graphs for emission characteristics and resultant angle-dependent CIE color locus distributions for optoelectronic components in accordance with further exemplary embodiments.

FIG. 5A shows the resultant emission characteristics 501, 502 and 503 as angle-dependent emission intensities $I(\alpha)$ of the primary radiation. In this case, the emission intensity $I(\alpha)$ in accordance with curve 501 is the emission characteristic of the OLED I having an ETL thickness x of approximately 15 nm. The emission intensity $I(\alpha)$ in accordance with curve 502 is the emission intensity of the OLED II having an ETL thickness x of approximately 30 nm, while the emission intensity $I(\alpha)$ in accordance with curve 503 is the emission intensity of OLED III having an ETL thickness x of approximately 50 nm.

In this case, the OLED I having the emission characteristic 501 has essentially a Lambertian emission characteristic and represents a conventional OLED. By contrast, the OLEDs II and III have non-Lambertian emission characteristics in which the emission intensity $I(\alpha)$ rises from an emission angle $\alpha=0°$ up to a maximum angle $\alpha_{max}$, represented by the vertical lines 522 and 523, through to a maximum emission intensity $I_{max}$.

The emission characteristics were determined by means of the following method: instead of the wavelength conversion layer 2, a glass hemisphere having a diameter of 25 cm was arranged in centered fashion on the substrate 19 by means of a refractive index matching gel 6. By means of a goniometer and an optical waveguide spectrometer connected thereto, the primary radiation of the OLEDs I, II and III emerging from the glass hemisphere was measured as a function of the emission angle $\alpha$. By virtue of the geometry of the glass hemisphere, the angle of emergence of the primary radiation with respect to the surrounding air at the hemisphere surface was the same as the emission angle in the substrate 19. Since the glass hemisphere and the substrate 19 were refractive index matched, it was thus also possible to measure primary radiation having an emission angle that was greater than the angle of total reflection in the substrate 19. The measured emission characteristics therefore correspond to the emission characteristics of the respective organic layer sequences 1 of the OLEDs I, II and III. These are given by the primary radiation which can pass into the substrate 19, wherein only that proportion of the primary radiation which is reflected at or in the second electrode on account of the total reflection cannot pass into the substrate 19.

From the goniometer measurements it was also possible to determine the optical power of the three OLEDs I, II and III for an impressed current density of 7 mA/cm². The optical power in arbitrary units was 0.1074 for the OLED I, 0.1088 for the OLED II and 0.1141 for the OLED III.

Figure 5B:
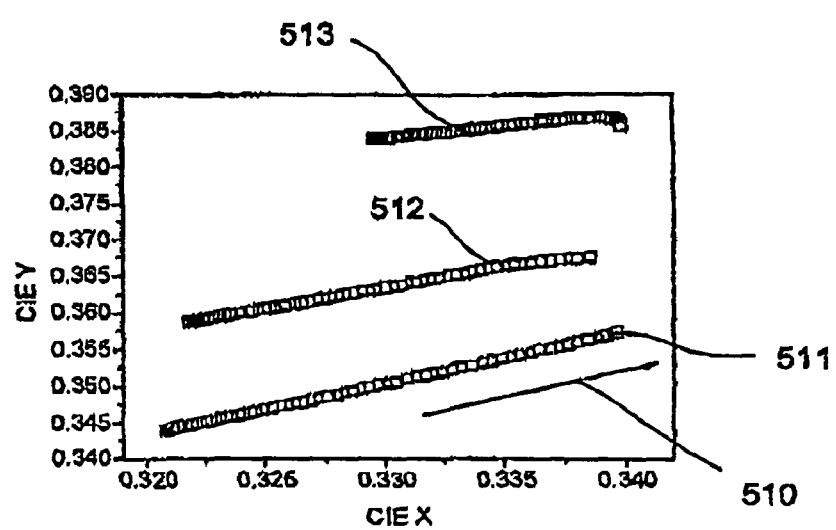

FIG. 5B shows the respective CIE color locus distributions of the superimpositions of the primary radiation and secondary radiation of the OLEDs I (measurement points 511), II (measurement points 512) and III (measurement points 513), once again equipped with the wavelength conversion layer 2 as shown in FIG. 3A. The arrow 510 indicates the increasing emission angle $\alpha$. The measurement was carried out by means of a standard goniometer. What is clearly evident is the reduction of the color variation of the resulting luminous impression depending on the emission angle, the more the emission characteristic deviates from the Lambertian emission characteristic in accordance with curve 501 in FIG. 5A. The slight shift in the color loci of the OLEDs I, II and III, relative to one another despite the use of identical materials is attributable in this case to the influence of the microcavity formed by the reflective first electrode 3.

The invention is not restricted to the exemplary embodiments by the description on the basis of said exemplary embodiments. Rather, the invention encompasses any new feature and also any combination of features, which in particular comprises any combination of features in the patent claims, even if this feature or this combination itself is not explicitly specified in the patent claims or exemplary embodiments.

We claim:

1. An optoelectronic component, comprising:
a first electrode;
a radiation-emitting layer sequence having an active region on the first electrode, which region has a main extension plane with a surface normal and emits an electromagnetic primary radiation having a non-Lambertian emission characteristic;
a second electrode on the radiation-emitting layer sequence, said second electrode being transparent to the primary radiation; and
a wavelength conversion layer in the beam path of the primary radiation, which converts the primary radiation at least partly into an electromagnetic secondary radiation,
wherein the first electrode is reflective to the primary radiation,
wherein the non-Lambertian emission characteristic is given by an intensity $I(\alpha)$ of the primary radiation of the radiation-emitting layer sequence as a function of an emission angle $\alpha$ measured with respect to the surface normal,
wherein the intensity $I(\alpha)$ increases from $\alpha \geq 0°$ with increasing angle $\alpha$ up to a maximum angle $\alpha_{max}$, and
wherein the conversion probability of the electromagnetic primary radiation in the wavelength conversion layer increases as the emission angle $\alpha$ increases.

2. The optoelectronic component as claimed in claim 1, wherein the emission characteristic has a maximum intensity $I_{max}$ at a maximum angle $\alpha_{max}$ of greater than or equal to 10° and less than or equal to 75°.

3. The optoelectronic component as claimed in claim 1,
wherein the emission characteristic has an intensity $I_0$ for an angle $\alpha=0°$,
wherein the emission characteristic has an intensity $I(\alpha)$ for angles $\alpha$ where $0° \leq \alpha \leq 15°$, where $I(\alpha)=I_0[1/\cos \alpha + A(\alpha)]$, and
$A(\alpha)$ assumes values in the range $-0.8 \leq A(\alpha) \leq 0.8$ for $0° \leq \alpha \leq 15°$.

4. The optoelectronic component as claimed in claim 1,
wherein the first electrode comprises a material having a reflectance R for the electromagnetic primary radiation,
wherein the radiation-emitting layer sequence has a refractive index n,
wherein the active region has a thickness d and is arranged at an average distance L from the first electrode, and
wherein the average distance L is set such that the organic layer sequence with the first and second electrodes has the non-Lambertian emission characteristic.

5. The optoelectronic component as claimed in claim 4, wherein the average distance L is less than or equal to half the wavelength and greater than or equal to 1/20 of the wavelength of the electromagnetic primary radiation.

6. The optoelectronic component as claimed in claim 4, wherein the thickness d of the active region is less than or equal to 20 nm.

7. The optoelectronic component as claimed in claim 1, wherein the radiation-emitting layer sequence furthermore has a substrate and
wherein the first electrode is arranged directly on the substrate.

8. The optoelectronic component as claimed in claim 1, wherein the radiation-emitting layer sequence furthermore has a substrate, and
wherein the second electrode is arranged directly on the substrate.

9. The optoelectronic component as claimed in claim 1, wherein the wavelength conversion layer comprises a wavelength conversion substance on a transparent carrier substrate.

10. The optoelectronic component as claimed in claim 1, wherein the wavelength conversion layer comprises a wavelength conversion substance in a transparent matrix material.

11. The optoelectronic component as claimed in claim 10, wherein the matrix material comprises silicones, epoxides, acrylates, imides, carbonates, olefins or mixtures or combinations thereof.

12. The optoelectronic component as claimed in claim 1, wherein the wavelength conversion layer is optically coupled to the radiation-emitting layer sequence by means of an optical gel.

13. The optoelectronic component as claimed in claim 1, wherein the radiation-emitting layer sequence comprises an organic layer sequence.

14. The optoelectronic component as claimed in claim 13, wherein the active region comprises at least one organic polymer, an organic oligomer, an organic monomer, organic small molecules or a combination thereof.

15. The optoelectronic component as claimed in claim 1, wherein the second electrode comprises at least one transparent material from a group consisting of
a metal,
a metal oxide, and
an organic electrically conductive material.

16. The optoelectronic component as claimed in claim 1, wherein the first electrode comprises aluminum, barium, indium, silver, gold, magnesium, calcium or lithium or compounds, combinations or alloys thereof.

17. The optoelectronic component as claimed in claim 1, wherein the electromagnetic primary radiation has a wavelength range from an ultraviolet to blue wavelength range.

18. The optoelectronic component as claimed in claim 1, wherein the electromagnetic secondary radiation has a wavelength range from a blue to red wavelength range.

* * * * *